(12) United States Patent
Blackwell et al.

(10) Patent No.: US 7,763,317 B2
(45) Date of Patent: Jul. 27, 2010

(54) HIGH K DIELECTRIC GROWTH ON METAL TRIFLATE OR TRIFLUOROACETATE TERMINATED III-V SEMICONDUCTOR SURFACES

(75) Inventors: James M. Blackwell, Portland, OR (US); Willy Rachmady, Beaverton, OR (US); Gregory J. Kearns, Eugene, OR (US); Darryl J. Morrison, Calgary (CA)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 11/694,781

(22) Filed: Mar. 30, 2007

(65) Prior Publication Data
US 2008/0241423 A1 Oct. 2, 2008

(51) Int. Cl.
*C23C 16/00* (2006.01)
(52) U.S. Cl. .................. 427/255.11; 438/758; 438/765; 438/769; 438/778; 117/84; 117/88; 117/104; 427/255.28; 427/255.29; 427/255.31; 427/255.34
(58) Field of Classification Search .................. 438/758, 438/765, 769, 778; 427/255.11, 255.28, 427/255.29, 255.31, 255.34; 117/84, 88, 117/104
See application file for complete search history.

(56) References Cited
U.S. PATENT DOCUMENTS
5,580,694 A * 12/1996 Allen et al. .............. 430/270.1
7,491,653 B1 * 2/2009 Papasouliotis et al. ...... 438/778

OTHER PUBLICATIONS

Shinoda et al., "CVD Al2O3 Films on III-V Binary Semiconductors" 1980, Japanese Journal of Applied Physics, vol. 19 No. 6, pp. L299-L301.*

* cited by examiner

*Primary Examiner*—Alexander G Ghyka
*Assistant Examiner*—Leonard Chang
(74) *Attorney, Agent, or Firm*—Blakely, Sokoloff, Taylor & Zafman LLP (57) ABSTRACT

Surface preparation of a compound semiconductor surface, such as indium antimonide (InSb), with a triflating agent, such as triflic anhydride or a trifluoroacetylating agent, such as trifluoroacetic anhydride is described. In one embodiment, the triflating or trifluoroacetylating passivates the compound semiconductor surface by terminating the surface with triflate trifluoroacetate groups. In a further embodiment, a triflating agent or trifluoroacetylating agent is employed to first convert a thin native oxide present on a compound semiconductor surface to a soluble species. In another embodiment, the passivated compound semiconductor surface is activated in an ALD chamber by reacting the triflate or trifluoroacetate protecting groups with a protic source, such as water ($H_2O$). Metalorganic precursors are then introduced in the ALD chamber to form a good quality interfacial layer, such as aluminum oxide ($Al_2O_3$), on the compound semiconductor surface.

17 Claims, 7 Drawing Sheets

TRIFLATING AGENT (XOX) =

FIG. 3B

TRIFLUOROACETYLATING AGENT (XOX) =

HIGH K DIELECTRIC GROWTH ON METAL TRIFLATE OR TRIFLUOROACETATE TERMINATED III-V SEMICONDUCTOR SURFACES

BACKGROUND OF THE INVENTION

1. Field of the Invention

The present invention generally relates to the formation of non-native films on surfaces of compound semiconductor films, and more particularly relates to the preparation of III-V semiconductor surfaces for deposition and the subsequent deposition of a film by the Atomic Layer Deposition (ALD) method.

2. Discussion of Related Art

For many decades compound semiconductor materials, such as those formed from alloys of group III atoms with group V atoms (III-V semiconductors), have found limited application in microelectronics primarily because the native oxide which forms on these materials is of very poor quality relative to the native oxide which forms on homogeneous group IV semiconductors, such as silicon (Si). This relatively poor quality of the native oxide degrades the electrical performance of microelectronic devices fabricated from III-V semiconductors. For example, because the native oxide of compound semiconductor devices is a leaky insulator, it has not been possible to form high quality metal oxide semiconductor field effect transistors (MOSFET) with the native oxide as a gate dielectric. Thus, to date, only bipolar junction transistors (BJT) and junction field effect transistors (JFET) are commercially fabricated in high volume from compound semiconductor materials, neither of which provides all of the many of the advantages of the MOSFET.

Meanwhile, while the good electrical quality of the native oxide of silicon (silicon dioxide) has enabled the rapid scaling of silicon-based MOSFET transistors over many decades, device dimensions have reached the point where the thickness of silicon dioxide in the MOSFET gate dielectric is only a few monolayers and has therefore also become unacceptably leaky. Thus, advancement of silicon MOSFET fabrication has reached the point where the native oxide of silicon is just as inadequate as that of the native oxide of compound semiconductors. In response, the gate dielectric in the silicon MOSFET has begun to migrate from the native oxide of silicon to a non-native, high dielectric constant (high-K) material, such as hafnium oxide ($HfO_2$), deposited on the silicon surface by chemical vapor deposition (CVD) or a variant thereof typically referred to as atomic layer deposition (ALD).

Figure 1:
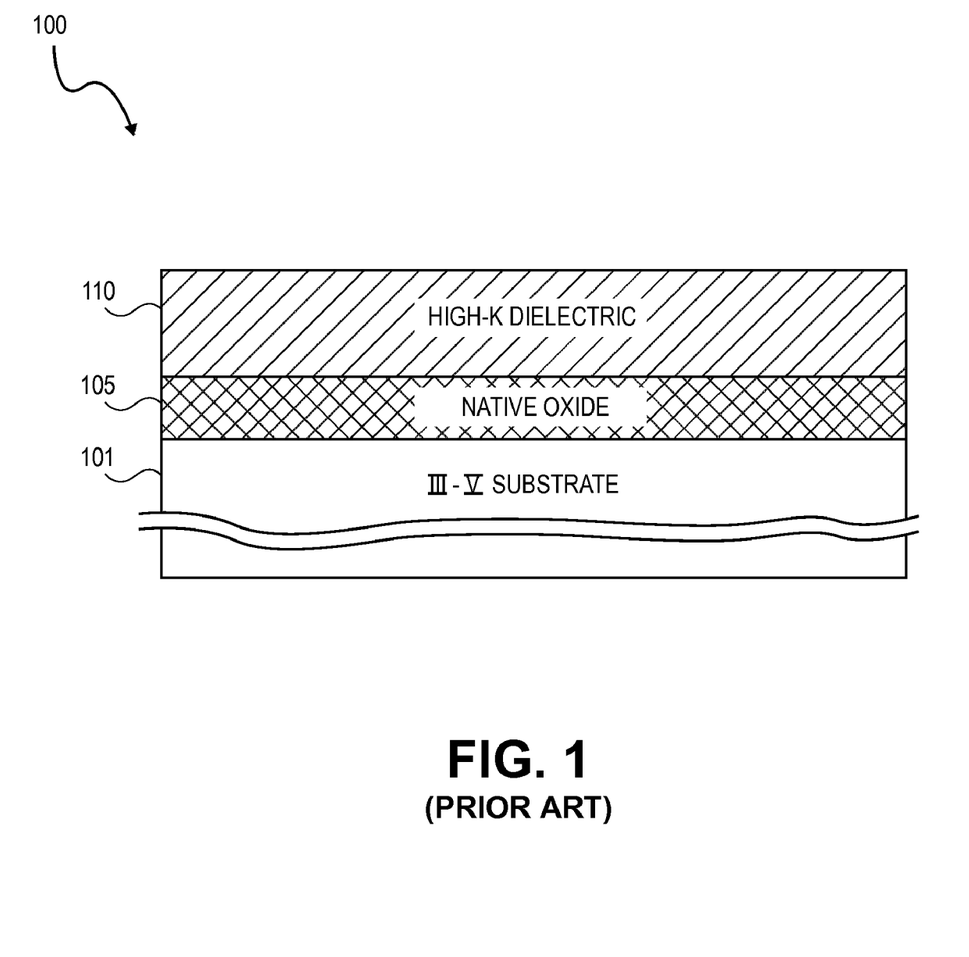
FIG. 1 depicts a cross-section of a conventional high-K dielectric film over a compound semiconductor surface having native oxide.

The success of high-k gate dielectric formation by ALD on silicon has attracted interest in the application of high-k gate dielectrics to compound semiconductor MOSFETS. However, as shown in FIG. 1, it remains difficult to provide a surface on the compound semiconductor substrate, such as III-V substrate 101, enabling an ALD process to form a high quality dielectric film. In particular, the presence of even a few monolayers of the poor quality native oxide 105 on III-V substrate 101 prior to ALD of high-k dielectric 110 is high highly detrimental to the performance of a microelectronic device. Because there is currently no means to provide for high-k dielectric 110 directly on III-V substrate 101 without poor quality native oxide 105, the detrimental properties of native oxide 105 continue to result in a gate dielectric unsuitable for high performance transistors.

DETAILED DESCRIPTION OF THE PRESENT INVENTION

In various embodiments, surface preparation and ALD film growths on compound semiconductor surfaces are described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Embodiments of the present invention include the surface treatment of compound semiconductors in preparation of deposition of an interfacial layer. More specifically, the compound semiconductor surface is chemically treated to etch a thin native oxide, if present, by converting the oxide into a soluble species and then removing it. The compound semiconductor surface is passivated with a species providing sufficient steric hindrance and bond strength to retard formation of native oxide on the compound semiconductor surface under standard temperature and pressure (STP) conditions. The passivating species has sufficiently weak bonding to the compound semiconductor surface that it may then be removed under controlled conditions to activate the compound semiconductor surface for a chemical deposition of a desired film. Particular embodiments include the etch, passivation, and activation of a compound semiconductor surface, such as a III-V semiconductor like indium antimonide (InSb), in preparation for the formation of a dielectric film, such as a high-k dielectric, by a method such as ALD. In one such embodiment, a triflating agent, such as triflic anhydride, is employed to passivate a compound semiconductor surface by terminating the surface with triflate groups. In another embodiment a trifluoroacetylating agent, such as trifluoroacetic anhydride, is employed to passivate a compound semiconductor surface by terminating the surface with trifluoroacetate groups. In a further embodiment, a triflating agent or trifluoroacetylating agent is employed to first convert a thin native oxide present on a compound semiconductor surface to a soluble metal triflate or metal trifluoroacetate species, and then passivate the compound semiconductor surface by terminating the surface with triflate or trifluoroacetate groups. In still another embodiment, the compound semiconductor surface is activated by converting triflate or trifluoroacetate terminal groups to hydroxyl or amine terminal groups an exposure to a protic source in an ALD chamber. In a further embodiment, ALD precursors then react with the hydroxyl or amine rich compound semiconductor surface in the ALD chamber to form an ALD seed layer that enables a good quality non-native film to be formed on the compound semiconductor surface. In an alternate embodiment, metalorganic precursors react directly with triflate or trifluoroacetate groups terminating the compound semiconductor surface to form an ALD seed layer that enables a good quality non-native film to be formed on the compound semiconductor surface.

Figure 2:
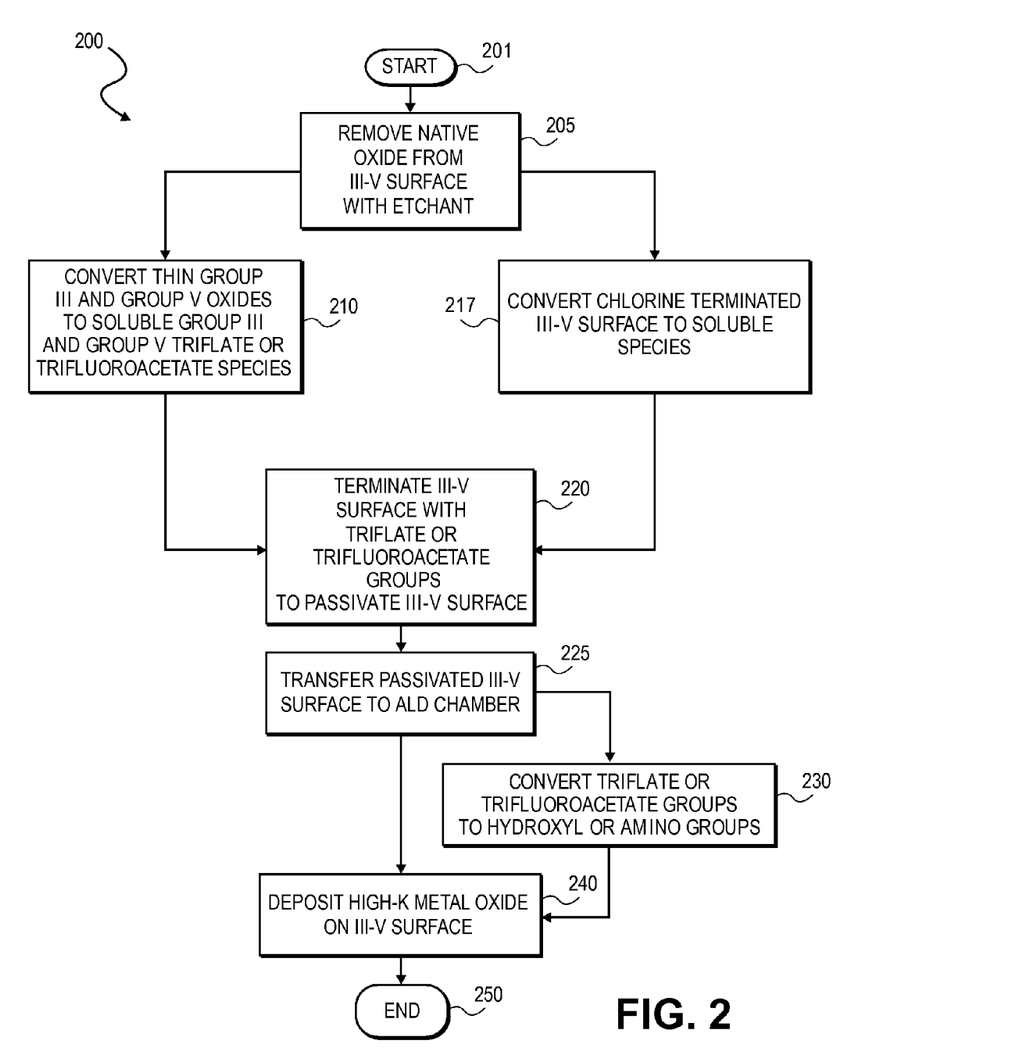
FIG. 2 is a process flow depicting formation of a high-K dielectric on a compound semiconductor surface in accordance with an embodiment of the present invention.

FIG. 2 depicts a flow chart of an exemplary method to form a high-k dielectric on the surface of a III-V compound semiconductor. The method 200 depicted in FIG. 2 should merely be considered instructive of the synergy between various aspects of the present invention rather than a rigid sequence of operations that must all be carried out each and every time any embodiment of the present invention is practiced.

Method 200 starts at operation 201 with a III-V semiconductor surface upon which a non-native film is desired. The compound semiconductor surface may be of any commonly known binary, tertiary and quaternary III-V alloy. Such III-V alloys include, but are not limited to, indium antimonide (InSb), aluminum arsenide (AlAs), gallium arsenide (GaAs), gallium nitride (GaN), indium phosphide (InP), aluminum indium antimonide (AlInSb) indium antimonide arsenide (InSbAs), aluminum gallium arsenide (AlGaAs), indium gallium arsenide (InGaAs), indium aluminum arsenide (InAlAs), indium arsenic antimonide (InAsSb), indium gallium phosphide, (InGaP), indium gallium arsenide phosphide (InGaAsP), and indium aluminum gallium arsenide (InAlGaAs). Furthermore, a compound semiconductor surface of II-VI alloys, such as cadmium telluride (CdTe) or zinc selenide (ZeSe), should also be considered within the scope of the present invention. It should further be appreciated that the compound semiconductor surface may be supported by an arbitrary substrate, which need not also be a compound semiconductor. Thus, the substrate material may be, but is not limited to, monocrystalline semiconductors such as silicon, germanium, gallium arsenide, and indium phosphide, polycrystalline semiconductors, insulators such as glass, quartz, sapphire, as wells as various plastic or polymer films.

At operation 205, in a wet chemistry processing apparatus, thick native oxides on the III-V semiconductor surface are removed using an etchant. Generally, a native oxide more than three monolayers thick is considered a thick native oxide. Typically, the native oxide which forms on a III-V semiconductor surface at standard temperature a pressure (STP) conditions saturates at a thickness on the order of 80 Å. In an embodiment, the thick native oxide is removed using standard acidic etchants comprising hydrochloric acid (HCl) or hydrofluoric acid (HF), such as dilute HF (e.g. 50:1 DI:HF) or buffered HF (e.g. trimix and other buffered HF-based etchants). In an alternate embodiment, the thick native oxide is removed using standard basic etchants, such as ammonia hydroxide ($NH_4OH$) and tetramethylammonium hydroxide (TMAH). The wet chemistry processing apparatus may be any commonly employed device, such as, but not limited to, batch wet chemical stations where a chemistry is applied to a plurality of substrates in parallel or single wafer processing stations where individual substrates are serially processed through a chemistry.

Following the removal of the thick native oxides at operation 205, the compound semiconductor surface is chemically treated with a triflating or trifluoroacetylating agent to passivate the III-V semiconductor surface by terminating the surface with triflate or trifluoroacetate groups, as denoted by operation 220 in FIG. 2. In a particular embodiment, the removal of the thick native oxides at operation 205 leaves the III-V semiconductor surface with a thin surface oxide between one and three monolayers thick. As previously discussed, the presence of such a surface oxide is detrimental to a microelectronic device. Thus, in this embodiment, to achieve a passivated III-V semiconductor surface, the triflating or trifluoroacetylating agent is employed to first convert the remaining thin surface oxide into soluble species at operation 210. The wet chemical solution may then remove the soluble species from the III-V semiconductor surface. In an alternate embodiment, the removal of the thick native oxides at operation 205 leaves the III-V semiconductor surface terminated with a halogen, such as fluorine or chlorine. Such halogen termination is inadequate to passivate the III-V semiconductor surface because the halogen is not bulky enough to provide the steric hindrance required to adequately retard further oxidation of the III-V semiconductor surface under STP conditions. Thus, in this embodiment, in order to achieve a passivated III-V semiconductor surface, the triflating or trifluoroacetylating agent is employed to first convert the halogen terminal groups into soluble species at operation 217. The wet chemical solution may then remove the soluble species from the III-V semiconductor surface. In certain embodiments, a wet chemistry processing apparatus is employed to treat the III-V semiconductor surface with triflating or trifluoroacetylating agent. Here too, the wet chemistry processing apparatus may be any commonly employed device, such as, but not limited to, batch wet chemical stations and single wafer processing stations. In a particular embodiment, the same wet chemistry processing apparatus employed for operation 205 is also employed for operation 210 and/or operation 217 and operation 220.

Figure 3A:
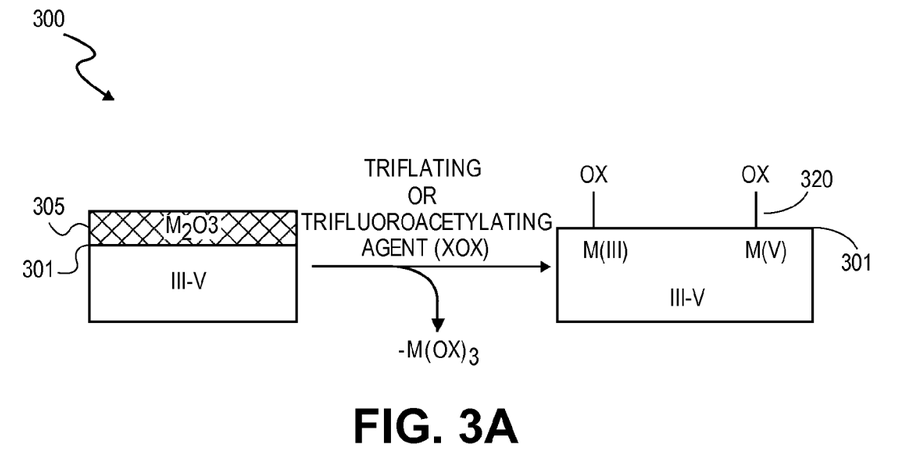
FIG. 3A-3C depicts removal of native oxides from a compound semiconductor surface and passivation of the compound semiconductor surface in accordance with an embodiment of the present invention.
Figure 3B:
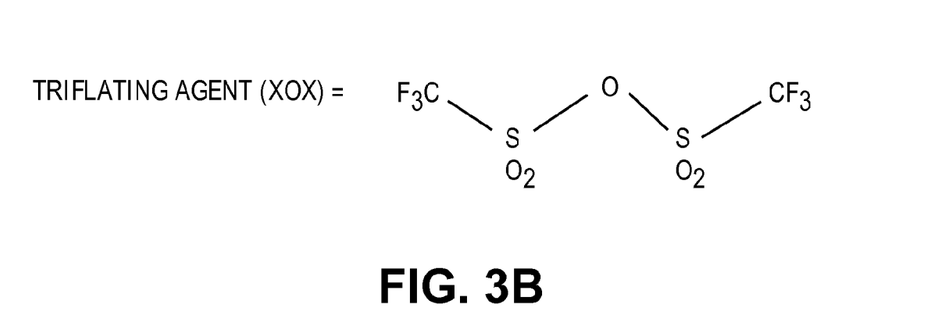
Figure 3C:
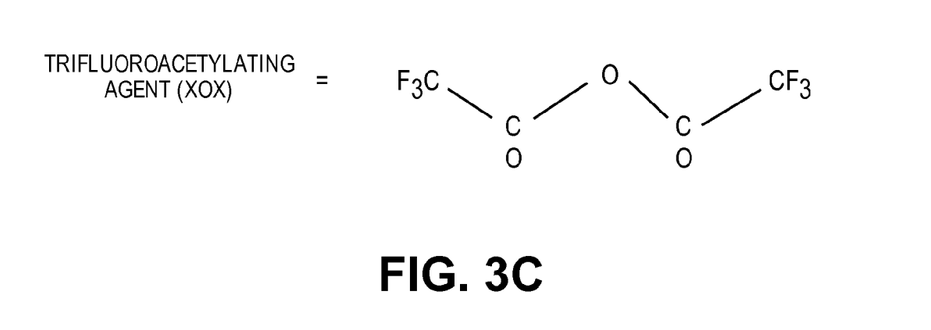

FIGS. 3A-3C further describe the removal of a thin native oxide from the compound semiconductor surface and passivation of the compound semiconductor surface by the triflating or trifluoroacetylating species, such as denoted by operations 210 and 220 of FIG. 2. As shown in method 300 of FIG. 3A, a thin surface oxide 305 of between one and three monolayers is on III-V surface 301. Thin surface oxide 305 is represented as $M_2O_3$, where M is a group III metal atom or group V metal atom comprising the semiconductor. In one exemplary embodiment where III-V surface 301 is InSb, thin surface oxide 305 is comprised predominantly of group III oxide, $In_2O_3$, with a lesser amount of group V oxide, $Sb_2O_3$. Furthermore, suboxides, such as $InSbO_4$ may also be present.

As further shown in FIG. 3A, thin surface oxide 305 is exposed to a triflating or trifluoroacetylating agent, some embodiments of which are represented in the Figure as XOX. In one embodiment, the triflating agent is triflic anhydride, having the chemical formula $(CF_3SO_2)_2O$, and commonly denoted as $Tf_2O$. Triflic anhydride has the general molecular structure depicted in FIG. 3B. Thus, for this embodiment, XOX in FIG. 3A represents an oxygen atom, O, bonded to two triflyl protecting groups, X. In other embodiments, the triflating agent may include tialklysilyl triflate ($R_3SiOTf$), and trialkylstannyl triflate ($R_3SnOTf$), where R is an alkyl including methyl ($CH_3$), ethyl ($C_2H_5$), iso-propyl ($C_3H_7$), and n-butyl ($C_4H_9$). In certain embodiments, the triflating agent is mixed in a non-polar solvent such as toluene or ether, to a concentration of between 0.01M and 1.0M. In a particular embodiment, triflic anhydride is mixed in toluene to a concentration of 0.02M. In alternate embodiments, tetrahydrofuran, and ethylacetate are employed as the solvent.

In an alternate embodiment, the trifluoroacetylating agent is trifluoroacetic anhydride. Thus, in FIG. 3A, XOX, represent an oxygen atom, O, bonded to two trifluoroacetyl (TFA) protecting groups, X. Trifluoroacetic anhydride, having the chemical formula $(CF_3CO)_2O$, is further depicted in FIG. 3C. An alternate trifluoroacetylating agent is trifluoroacetyl triflate, commonly denoted as TFAT, and having the chemical formula of ($CF_3COOTf$). In certain embodiments, the trifluoroacetylating agent is mixed in a non-polar solvent such as toluene or ether, to a concentration of between 0.01M and 1.0M. In a particular embodiment, trifluoroacetic anhydride is mixed in ether to a concentration of 0.02M.

As depicted in FIG. 3A, thin surface oxide 305 is converted by the triflating or trifluoroacetylating agent into soluble metal (group III and/or group V) triflate or soluble metal (group III and/or group V) trifluoroacetate species following a purely consumptive reaction pathway to form no byproducts. For the exemplary thin surface oxide 305 of $M_2O_3$, the reaction proceeds as:

$3(XOX)+M_2O_3 \rightarrow 2M(OX)_3$ (Equation 1)

Where, XOX again represents an embodiment of the triflating agent, such as triflic anhydride, or an embodiment of the trifluoroacetylating agent, such as trifluoroacetic anhydride. The soluble metal triflate or soluble metal trifluoroacetate species, $M(OX)_3$, is then removed by dissolution. The metal triflate or trifluoroacetate species may also adsorb to the III-V semiconductor surface 301. Thus, in a particular embodiment where the III-V semiconductor is comprised of InSb, a triflating agent of triflic anhydride forms the soluble $In(TfO)_3$. Similarly, soluble $Sb(TfO)_3$ may be formed as well.

As further shown in FIG. 3A, the same chemical agent capable of cleanly consuming the thin surface oxide 305 additionally terminates the III-V semiconductor surface with a sufficiently bulky protecting group to sterically hinder further oxidation of the semiconductor surface upon its removal from the wet chemical processing apparatus. Thus, the conversion of the thin surface oxide at operation 210 to a soluble species is distinguished from the thick oxide etch of operation 205 in that the triflating or trifluoroacetylating agent converting the oxide additionally provides passivation to the III-V semiconductor surface upon removal of the soluble species. As denoted by surface bond 320 in FIG. 3A, the III-V semiconductor surface is terminated with a triflate or trifluoroacetate group. These groups provide a bulky triflyl or trifluoroacetyl protecting group, X, chemically bonded to a group III and/or group V surface atom with an oxygen linking atom, thereby triflating or trifluoroacetylating the III-V semiconductor surface. For example, in an embodiment employing triflic anhydride, the triflate protecting group, X, is triflyl, or Tf. The bulky Tf terminal group bonded to an oxygen (O) linking atom forms a triflate terminal group capping the group III and/or group V surface atom.

Figure 4:
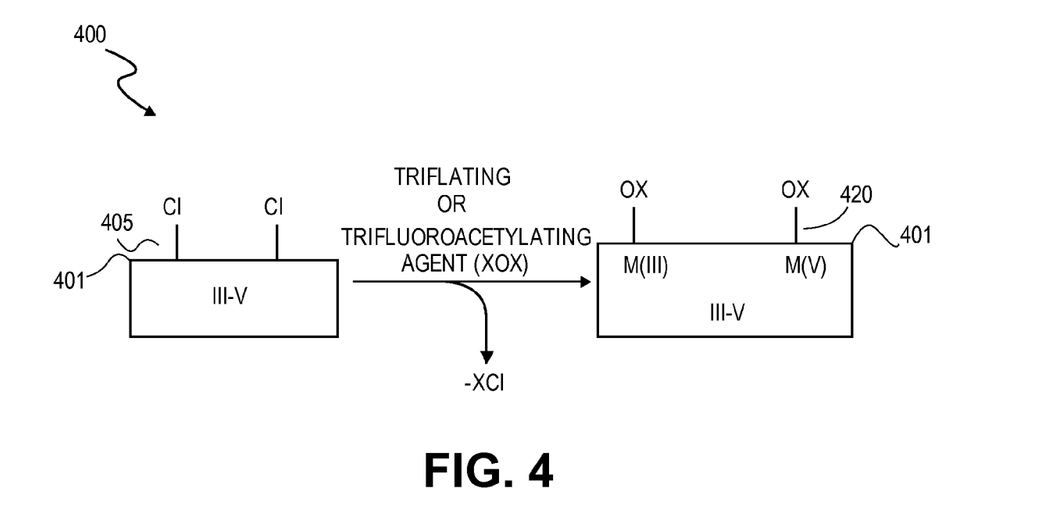
FIG. 4 depicts removal of halogen terminal groups from a compound semiconductor surface and passivation of the compound semiconductor surface in accordance with an embodiment of the present invention.

FIG. 4 further describes an embodiment where a triflating or trifluoroacetylating agent is employed to convert the halogen terminal groups on a III-V semiconductor surface into soluble species which may then be removed from the III-V semiconductor surface. As shown in method 400 of FIG. 4, a chlorine terminal group 405 is present on III-V semiconductor surface 401. Halogen termination can occur as a result of the etching of native oxides with a halogen-containing etchant chemistry, such as HF or HCl. Halogen termination however is unable to passivate a III-V semiconductor surface 401 shortly after the surface is removed from the halogen-containing etchant chemistry. Generally, this is because the polarity and/or bond length between group III and group V atoms, such as In and Sb, is too great to prevent oxidation of the metallic atoms on the III-V semiconductor surface at STP conditions.

Chlorine terminal group 405 is the halogen exposed to a triflating or trifluoroacetylating agent, some embodiments of which are represented in the Figure as XOX. Chlorine terminal group 405 is converted by the triflating or trifluoroacetylating agent into soluble species. In one embodiment, the triflating agent is triflic anhydride having a concentration in a solvent as described above in reference to FIG. 3A to form triflyl chloride ($CF_3SO_2Cl$) and a triflate anion. In an alternate embodiment, the triflating agent is trialkylsilyl triflate ($R_3SiOTf$), where the alkyl may include methyl ($CH_3$), ethyl ($C_2H_5$), iso-propyl ($C_3H_7$), and n-butyl ($C_4H_9$), and the soluble species formed is trialkylsilyl chloride ($R_3SiCl$). In still another embodiment employing as the triflating agent trialkylstannyl triflate ($R_3SnOTf$), where the alkyl may include methyl ($CH_3$), ethyl ($C_2H_5$), iso-propyl ($C_3H_7$), and n-butyl ($C_4H_9$), the soluble species formed is trialkylstannyl chloride ($R_3SnCl$). In still other embodiments, a trifluoroacetylating agent, such as those described above in reference to FIG. 3A, is employed to remove a surface terminating halogen.

As further shown in FIG. 4, the same chemical agent that cleanly consumes chlorine terminal group 405 also terminates III-V semiconductor surface 401 with a sufficiently bulky protecting group to sterically hinder further oxidation of the semiconductor surface upon removal from the wet chemical processing apparatus, thereby passivating III-V semiconductor surface 401. As denoted by surface bond 420, the III-V semiconductor surface is terminated with a triflate or trifluoroacetate group, as previously discussed in reference to FIG. 3A. Thus, as shown in the embodiments depicted in FIGS. 3A and 4, the same chemical agent is able to cleanly convert both an oxidized and halogenated III-V semiconductor surface into a III-V semiconductor surface passivated with triflate or trifluoroacetate groups. This dual pathway is advantageous because the triflating or trifluoroacetylating agent may thereby provide a consistent reaction product for either an oxidized or halogenated surface resulting from a preceding thick (i.e. bulk) surface oxide etch, such as that of operation 205 of FIG. 2.

With operation 220 of FIG. 2 completed, the III-V surface is now terminated with triflate or trifluoroacetate groups and thereby sufficiently passivated that it may be transferred at operation 225 to a deposition chamber, such as one configured to perform an ALD process. In an embodiment, the triflate or trifluoroacetate groups are removed within the controlled environment of the ALD chamber to activate the III-V semiconductor surface for a subsequent film deposition. Thus, while the triflate or trifluoroacetate groups bond to the III-V semiconductor surface with sufficient strength to passivate the semiconductor surface at ambient conditions, the bonds are sufficiently weak that they are susceptible to further reactions within a deposition chamber to prepare, or activate, the semiconductor surface. Furthermore, certain of these reactions advantageously convert the triflate or trifluoroacetate groups into volatile species, enabling their removal from the III-V semiconductor surface.

Figure 5:
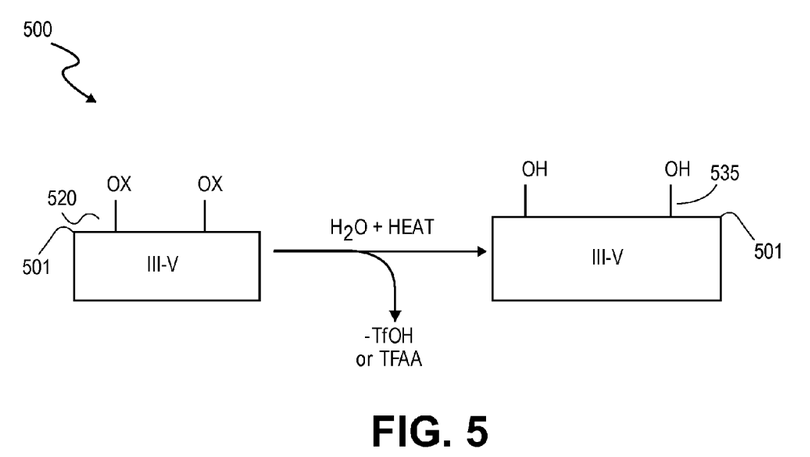
FIG. 5 depicts activation of a passivated compound semiconductor surface in accordance with an embodiment of the present invention.
Figure 6:
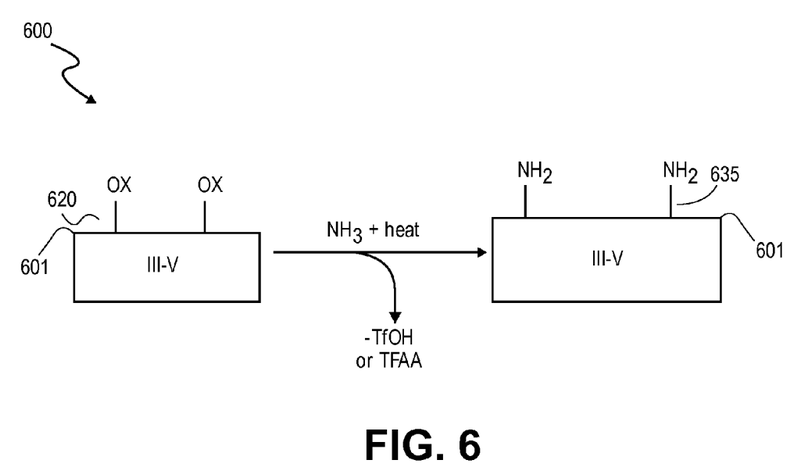
FIG. 6 depicts activation of a passivated compound semiconductor surface in accordance with an embodiment of the present invention.

In a particular embodiment, a triflate or trifluoroacetate group is removed by exposing the III-V semiconductor to a protic source. The protic source may be any commonly known to be compatible with general ALD process conditions. In specific embodiments, the protic source includes water ($H_2O$), ammonia ($NH_3$), and alcohols (ROH). Because the triflate or trifluoroacetate group is an excellent leaving group in certain nucleophilic substitution reactions, the triflate or trifluoroacetate group may be converted to an acid when exposed to a protic source in the presence of heat. Once formed, the acid may be volatilized to leave an activated surface upon which a film deposition can readily occur. In the embodiment shown in method 500 of FIG. 5, $H_2O$ is the protic source substituting a triflate group 520 with hydroxyl (OH—) terminal group 535, thereby liberating triflic acid (TfOH). In an alternate embodiment, $H_2O$ substitutes a trifluoroacetate group with a hydroxyl terminal group on the III-V semiconductor surface to liberate trifluoroacetic acid (TFAA). In still another embodiment, shown as method 600 in FIG. 6, ammonia ($NH_3$) is employed as the protic source substituting triflate group 620 with amine ($NH_2$—) terminal group 635, thereby liberating triflic acid (TfOH). In an alternate embodiment, $NH_3$ substitutes a trifluoroacetate group with an amine terminal group on the III-V semiconductor surface to liberate trifluoroacetic acid (TFAA). In all of these embodiments, the protic source may be provided within the ALD chamber in the form of a pulse that may contain gas alone or both gas and plasma. Similarly, as previously described, heat is provided to the III-V semiconductor surface within the ALD chamber. In a particular embodiment, the III-V semiconductor surface is heated to a temperature of between 150° C. and 400° C.

Next, returning to FIG. 2, with the III-V surface terminated with hydroxyl or amine groups, a film, such as the high-K metal oxide of operation 240, may be formed on the III-V semiconductor surface. In one embodiment, operation 240 includes reacting an ALD precursor with the hydroxyl or amine terminal group of the activated III-V semiconductor surface to form an ALD seed layer. Generally, this reaction proceeds readily in a manner analogous to that involving a hydroxyl or amine terminating a silicon semiconductor surface. In a particular embodiment, depicted as method 700 in FIG. 7A, a metalorganic precursor, such as trimethylaluminum (TMA), is reacted with hydroxyl terminal group 735 to form a seed layer comprising a metalorganic oxide moiety, such as dimethylaluminum oxide ($Me_2AlO$—) 738, tightly bonded to III-V semiconductor surface 701. In alternate embodiments, other commonly known precursors, such as, but not limited to, hafnium chloride ($HfCl_4$), are employed to react with a hydroxyl or amine terminal group of the activated III-V semiconductor surface.

Figure 7A:
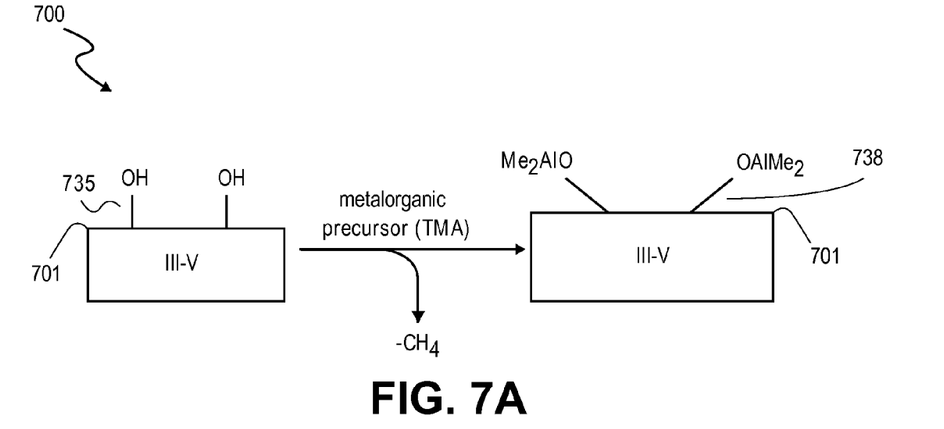
FIG. 7A depicts formation of an ALD seed layer on an activated compound semiconductor surface in accordance with an embodiment of the present invention.
Figure 7B:
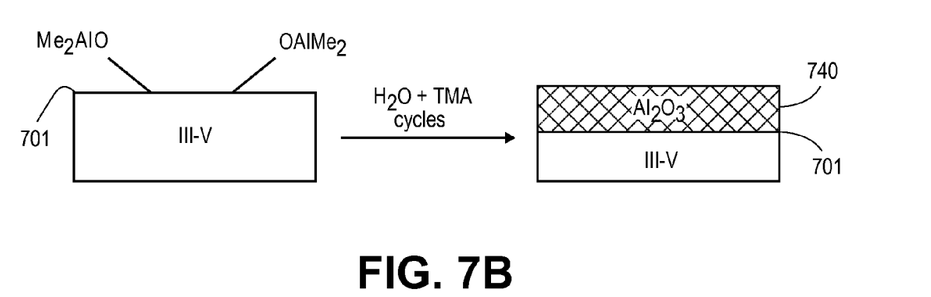
FIG. 7B depicts a formation of a high-K dielectric on an ALD seed layer in accordance with an embodiment of the present invention.

Finally, as a further step in operation 240 of FIG. 2, a high quality non-native film is grown on the ALD seed layer. The film growth may be performed employing standard ALD methods and process conditions commonly known in the art. In the particular embodiment shown in FIG. 7B, a $Me_2AlO$— seed layer, such as that produced in FIG. 7A, is subjected to successive cycles of $H_2O$, and TMA, to form the high-K dielectric, $Al_2O_3$ 740, on III-V semiconductor surface 701. In one such embodiment, $Al_2O_3$ 740 is formed on an InSb surface. Method 200 then ends at operation 250, where commonly known techniques are then employed to fabricate a microelectronic device utilizing the film deposited on the III-V semiconductor surface by method 200.

In an alternate implementation, as also shown in FIG. 2, operation 230 is omitted and a III-V surface terminated with triflate or trifluoroacetate groups in an ALD chamber is exposed directly to an ALD precursor without first converting the triflate or trifluoroacetate groups to hydroxyl or amine groups. Because the triflate or trifluoroacetate group is an excellent leaving group in certain nucleophilic substitution reactions, the triflate or trifluoroacetate group may react with the ALD precursor to directly form an ALD seed layer, such as those described in reference to FIG. 7A. In one such embodiment having a triflate group on the III-V semiconductor surface and an ALD precursor of TMA, methyl triflate ($CF_3SO_3CH_3$) is liberated as an ALD seed layer of $Me_2AlO$ forms on the III-V semiconductor surface. In an alternate embodiment, a III-V semiconductor surface terminated with a trifluoroacetate group is exposed to an ALD precursor of TMA and 1,1,1-triflouro propanone ($CF_3COCH_3$) is liberated as an ALD seed layer of $Me_2AlO$— forms on the III-V semiconductor surface. Other commonly known ALD precursors, such as those described in reference to FIG. 3A, may be similarly reacted with the triflate or trifluoroacetate group.

Figure 8:
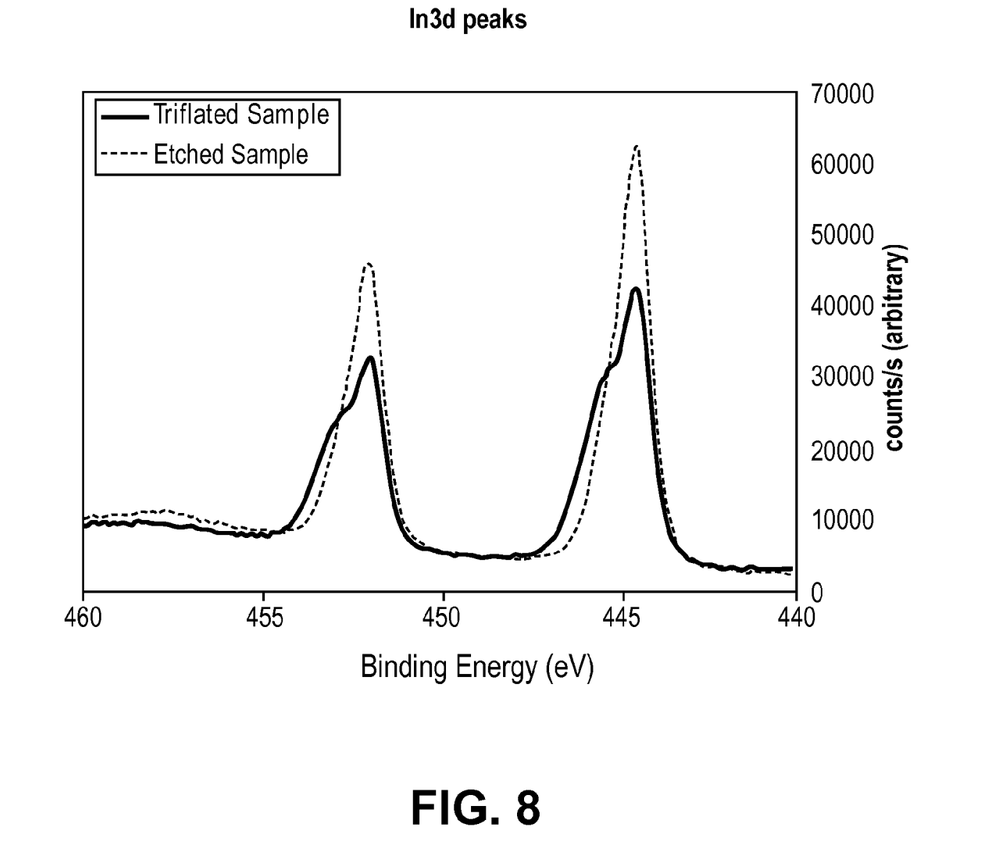
FIG. 8 depicts an XPS analysis of an InSb surface passivated in accordance with an embodiment of the present invention.

Shown in FIG. 8 are XPS results of a triflated InSb sample and that of an InSb control. The triflated sample was first etched in an HF-based chemistry, followed by a fifteen minute exposure to a 1.0M solution of triflic anhydride in ether The control sample was only etched with the HF-based chemistry. The XPS results indicate the In3d peaks of the triflated sample are shifted to 0.3 eV higher binding energy compared to $In_2O_3$, demonstrating triflate groups are bound to In. The $In_2O_3$ peak appears as a broadening of the In3d peaks due to overlap with the Sb bound In peak. As shown, when stronger electron withdrawing groups, such as —Cl or triflate, bind to In, the oxidized peak is shifted toward higher energy (left) compared to the Sb-bound In, making it easier to differentiate the two peaks in the triflated sample. Similarly, when the duration of the triflating treatment is extended to approximately 24 hours, the Sb3d3 peak is shifted to 0.1 eV higher binding energy.

Although the present invention has been described in language specific to structural features and/or methodological acts, it is to be understood that the invention defined in the appended claims is not necessarily limited to the specific features or acts described. For example, many applications may benefit from the triflating or trifluoroacetylating of compound semiconductor surfaces in accordance with the present invention and one of ordinary skill in the art would recognize the embodiments described as particularly graceful implementations of the claimed invention useful for illustrating the present invention.

What is claimed is:

1. A method comprising:
   exposing a III-V semiconductor surface, and a native oxide thereon, to a triflating or trifluoroacetylating agent to form a soluble metal triflate species or soluble metal trifluoroacetate species and to terminate the III-V semiconductor surface with triflate or trifluoroacetate groups.

2. The method of claim 1, further comprising:
   exposing the triflate or trifluoroacetate groups to a protic source in an ALD chamber, the protic source selected from the group consisting of: water (H2O), ammonia (NH3), and alcohols (ROH) to terminate the III-V semiconductor surface with hydroxyl groups or amine groups.

3. The method of claim 2, further comprising:
   exposing the hydroxyl groups or amine groups to a metalorganic precursor in the ALD chamber to form a metalorganic oxide seed layer on the III-V semiconductor surface.

4. The method of claim 1, further comprising:
   exposing the triflate or trifluoroacetate groups to a metalorganic precursor in the ALD chamber to form a metalorganic oxide seed layer on the III-V semiconductor surface.

5. The method of claim 4, wherein the metalorganic precursor is selected from the group consisting of trimethylaluminum (TMA) and hafnium chloride ($HfCl_4$).

6. The method of claim 1, wherein the triflating agent or trifluoroacetylating agent is in a solution of between 0.01 molarity (M) and 1.0 molarity (M).

7. The method of claim 6, wherein the triflating agent or trifluoroacetylating agent is in a non-polar solvent selected from the group consisting of: toluene, ether, tetrahydrofuran, and ethylacetate.

8. The method of claim 1, wherein the triflating agent is selected from the group consisting of: triflic anhydride (Tf2O), trialkylsilyl triflate (R3SiOTf, and trialkylstannyl triflate (R3SnOTf), where R is an alkyl.

9. The method of claim 8, wherein the alkyl is selected from the group consisting of: methyl (CH3), ethyl (C2H5), isopropyl (C3H7), and n-butyl (C4H9).

10. The method of claim 1, wherein the trifluoroacetylating agent is selected from the group consisting of: trifluoroacetic anhydride ((CF3CO)2O) and trifluoroacetyl triflate (CF3COOTf).

11. A method of passivating a III-V semiconductor surface comprising:
    converting an oxide on the III-V semiconductor surface to a soluble metal triflate or trifluoroacetate species;
    removing the soluble metal triflate or trifluoroacetate species; and
    chemically bonding a group III or group V surface atom to a triflyl (SO2CF3) protecting group or trifluoroacetyl (COCF3) protecting group with an oxygen linking atom to terminate the III-V semiconductor surface.

12. The method of claim 11, wherein the III-V semiconductor comprises indium as the group III atom and antimony as the group V atom.

13. The method of claim 11, further comprising:
    removing a native oxide with an etchant prior to chemically bonding the group III or group V surface atom to a triflate group or trifluoroacetate group, wherein the etchant contains at least one component selected from the group consisting of: HF and HCl.

14. A method of forming a high-K metal oxide on a III-V semiconductor surface comprising:
    providing in an ALD chamber, a III-V semiconductor surface terminated with a triflate group or trifluoroacetate group;
    converting the triflate group or trifluoroacetate group on the III-V semiconductor surface to either a hydroxyl group or an amine group; and
    reacting a metalorganic precursor with the hydroxyl or amine group on the III-V semiconductor surface to form the high-K metal oxide on the III-V semiconductor surface.

15. The method of claim 14, wherein converting the triflate group or trifluoroacetate group to a hydroxyl group further comprises:
    reacting the triflate group or trifluoroacetate group with water ($H_2O$) at an elevated temperature in the ALD chamber.

16. The method of claim 14, wherein converting the triflate group or trifluoroacetate group to an amine group further comprises:
    reacting the triflate group or trifluoroacetate group with ammonia ($NH_3$) at an elevated temperature in the ALD chamber.

17. The method of claim 14, wherein the metalorganic precursor is selected from the group consisting of trimethylaluminum (TMA) and hafnium chloride ($HfCl_4$).

* * * * *